(12) United States Patent
Ngo et al.

(10) Patent No.: US 7,525,393 B2
(45) Date of Patent: Apr. 28, 2009

(54) DIGITAL FREQUENCY MULTIPLIER CIRCUIT

(75) Inventors: Hung C. Ngo, Austin, TX (US); Fadi H. Gebara, Austin, TX (US); Jethro C. Law, Austin, TX (US); Trong V. Luong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/740,612

(22) Filed: Apr. 26, 2007

(65) Prior Publication Data

US 2008/0266000 A1 Oct. 30, 2008

(51) Int. Cl.
*H03L 7/00* (2006.01)

(52) U.S. Cl. .......................................... 331/25; 331/16

(58) Field of Classification Search .................. 331/16, 331/25, 51, 53, 1 A, 14–18, DIG. 2
See application file for complete search history.

(56) References Cited

U.S. PATENT DOCUMENTS 6,504,408 B1 * 1/2003 von Kaenel ................. 327/158
6,970,047 B1 * 11/2005 Johnson et al. ............... 331/45
7,177,611 B2 * 2/2007 Goldman .................... 455/260
7,425,874 B2 * 9/2008 Risbo et al. ................. 331/1 A

* cited by examiner

*Primary Examiner*—Rexford Barnie
*Assistant Examiner*—Christopher Lo
(74) *Attorney, Agent, or Firm*—Dillon & Yudell LLP

(57) ABSTRACT

A digital frequency multiplier circuit is disclosed. The digital frequency multiplier circuit includes a digitally controlled oscillator (DCO), a phase detector and a control circuit. The DCO generates an internal feedback signal. The phase detector detects a phase difference between the internal feedback signal and an external reference clock signal. Coupled between the phase detector and the DCO, the control circuit adjusts the DCO to align the internal feedback signal with the external reference clock signal after a phase difference between the internal feedback signal and the external reference clock signal has been detected. The control circuit also locks a modulation frequency of the DCO and monitors the state of the digital frequency multiplier circuit in order to maintain the lock.

6 Claims, 3 Drawing Sheets

DIGITAL FREQUENCY MULTIPLIER CIRCUIT

BACKGROUND OF THE INVENTION

1. Technical Field

The present invention relates to digital circuits in general, and more particularly, to digital frequency multiplier circuits.

2. Description of Related Art

Frequency multiplier circuits are commonly utilized in electronic devices, such as radio receivers/transmitters, to multiply a base frequency of an oscillator by a pre-defined number. The multiplied output frequency can then be amplified and/or sent to a final drive stage for delivery to another electronic device, such as a transmitting antenna.

Based on an input reference signal, a digital frequency multiplier circuit utilizes a voltage controlled oscillator (VCO), which is tuned to a harmonic of the input frequency signal, along with a frequency divider and a phase-locked loop (PLL) to generate a desired output frequency. The frequency divider located within the feedback loop of the PLL is coupled to the output of the VCO. The output of the frequency divider is thus fed back into a phase detector (PD), which compares the divided frequency to the reference signal and sends a signal to the VCO that increases the output frequency until the divided frequency is equal to the reference frequency. As a result, the output frequency of the frequency multiplier circuit is stabilized at a value equal to the reference frequency multiplied by the value of the frequency divider.

Conventional digital frequency multiplier circuits employ complicated algorithms and/or hardware to acquire, align, and lock an output frequency at a desired value. Such frequency multiplier circuits can consume large amounts of power and occupy precious physical space on circuit boards. Consequently, it would be desirable to provide an improved digital frequency multiplier circuit.

SUMMARY OF THE INVENTION

In accordance with a preferred embodiment of the present invention, a digital frequency multiplier circuit includes a digitally controlled oscillator (DCO), a phase detector and a control circuit. The DCO generates an internal feedback signal. The phase detector detects a phase difference between the internal feedback signal and an external reference clock signal. Coupled between the phase detector and the DCO, the control circuit adjusts the DCO to align the internal feedback signal with the external reference clock signal after a phase difference between the internal feedback signal and the external reference clock signal has been detected. The control circuit also locks a modulation frequency of the DCO and monitors the state of the digital frequency multiplier circuit in order to maintain the lock.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
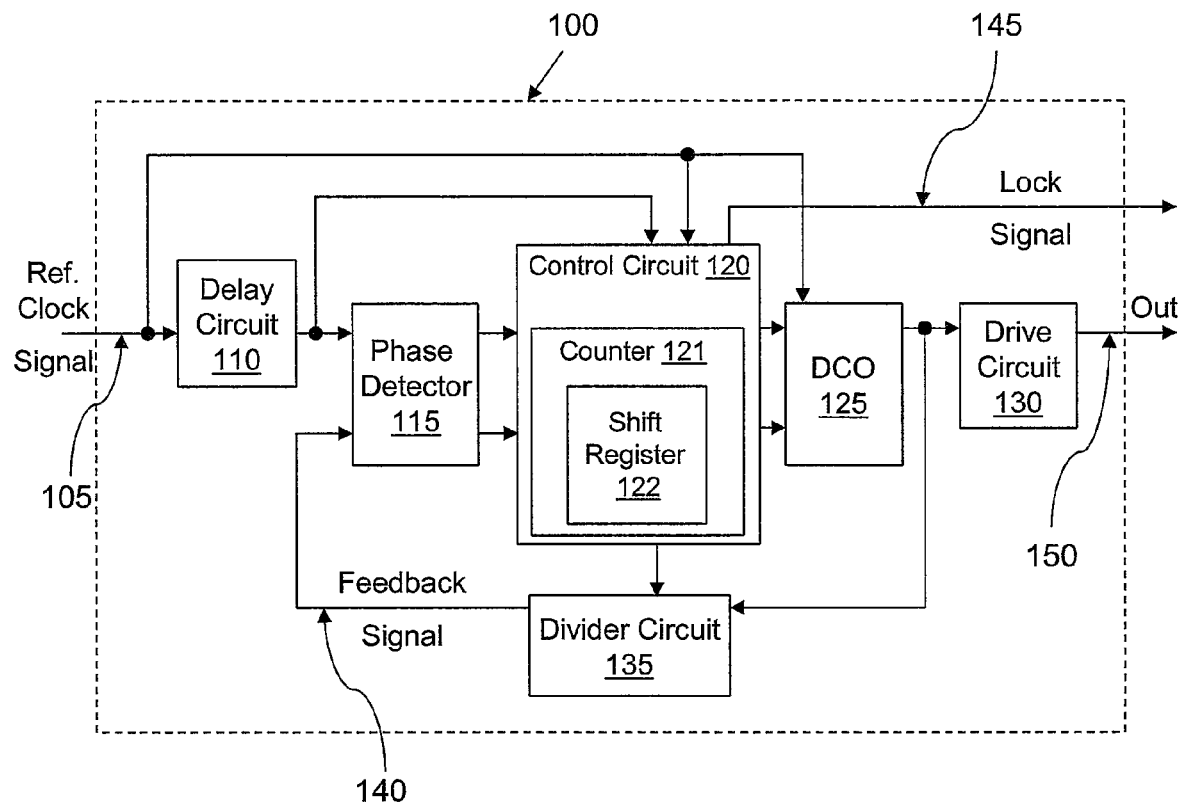
FIG. 1 is a block diagram of a digital frequency multiplier circuit, in accordance with a preferred embodiment of the present invention.

Referring now to the drawings, and specifically to FIG. 1, there is depicted a block diagram of a digital frequency multiplier circuit, in accordance with a preferred embodiment of the present invention. As shown, a digital frequency multiplier circuit 100 includes a delay circuit 110 coupled to a phase detector 115. The input of delay circuit 110 is connected to a reference clock signal 105 provided by a reference clock. The output of phase detector 115 is coupled to a control circuit 120 capable of providing the functions illustrated in FIGS. 2 and 3, which will be discussed below. Control circuit 120 receives reference clock signal 105 and the output of delay circuit 110. One or more output connections of control circuit 120 are coupled to a digitally controlled oscillator (DCO) 125 that also receives reference clock signal 105. Control circuit 120 generates a lock signal 145.

An output of DCO 125 is coupled to a drive circuit 130 that an output signal 150 for digital frequency multiplier 100. The output of DCO 125 is also coupled to an input of a divider circuit 135. As utilized herein, a divider circuit refers to a circuit that reduces the frequency of an oscillating input signal by a programmable multiplier m, where m is an integer. For example, if a 1 GHz clock signal is inputted into a divider circuit that has a value of m=4, the output of the divider circuit will be a 250 MHz clock signal. Divider circuit 135 generates a feedback signal 140 that is sent to an input of phase detector 115, thereby forming a feedback loop. Divider circuit 135 also receives input signals from control circuit 120.

Figure 2:
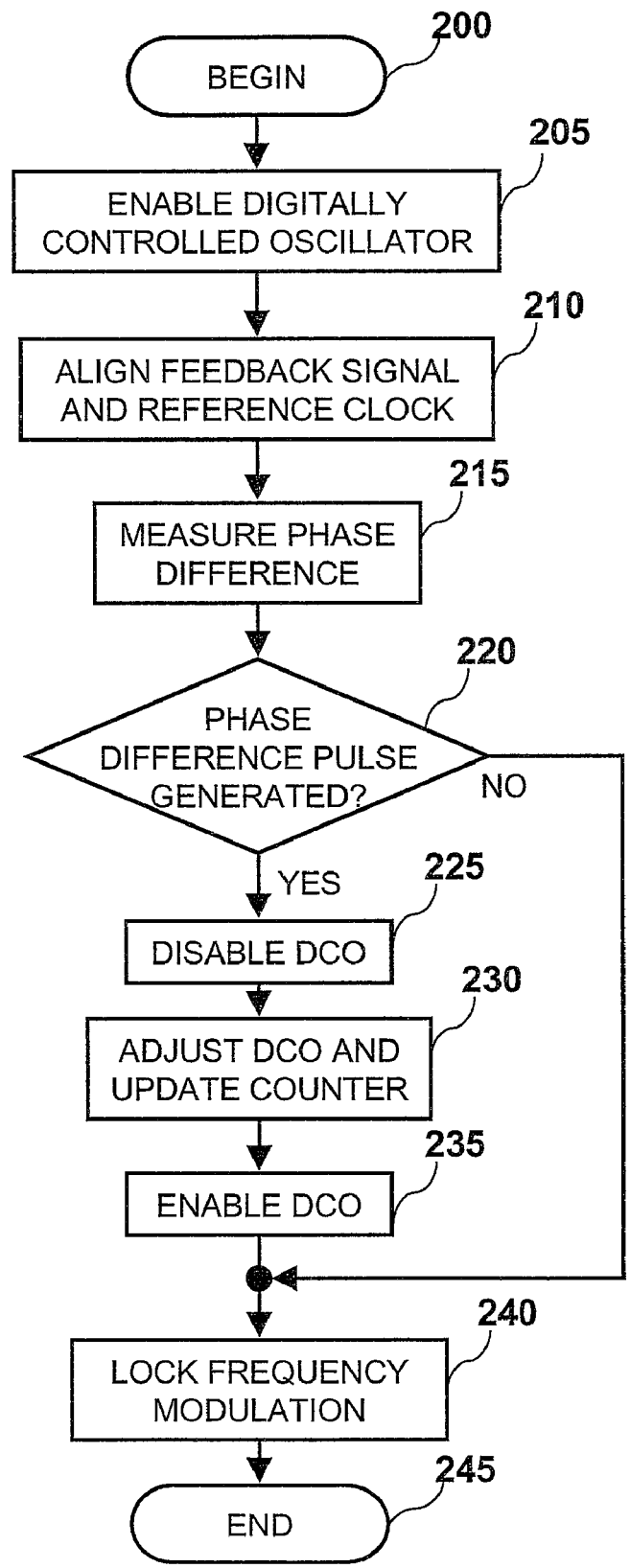
FIG. 2 is a high-level logical flow diagram of a method for locking the frequency of an output signal of the digital frequency multiplier circuit from FIG. 1, in accordance with a preferred embodiment of the present invention.

With reference now to FIG. 2, there is illustrated a high-level logical flow diagram of a method for locking the frequency of output signal 150 of digital frequency multiplier circuit 100 (from FIG. 1), in accordance with a preferred embodiment of the present invention. Starting at block 200, in response to the receipt of an input signal, control circuit 120 enables DCO 125, as depicted in block 205. By utilizing the output of delay circuit 110, and the output of phase detector 115, control circuit 120 aligns feedback signal 140 with reference clock signal 105, as shown in block 210. Control circuit 120 then measures the phase difference between feedback signal 140 and reference clock signal 105, as depicted in block 215.

Next, control circuit 120 determines whether or not phase detector 115 had generated a phase difference pulse, as shown in block 220. If phase detector 115 had generated a phase difference pulse, control circuit 120 temporarily disables DCO 125, as shown in block 225, adjusts DCO 125 to align its output (i.e., feedback signal 140) with reference clock signal 105, and updates counter 121 to show that DCO 125 has been adjusted, as depicted in block 230, and re-enables DCO 125, as shown in block 235. As utilized herein, a counter refers to a device, such as a shift register, that is capable of storing bits that correspond to the state of frequency multiplier circuit 100. For example, counter 121 may include shift register 122 that stores 4 bits and receives input from up pulses and down pulses from phase detector 115, as illustrated in FIG. 3, which will be discussed below.

Otherwise, if phase detector 115 had not generated a phase difference pulse, control circuit 120 locks the frequency modulation of digital frequency multiplier 100, as depicted in block 240, and the process terminates at block 245.

Figure 3:
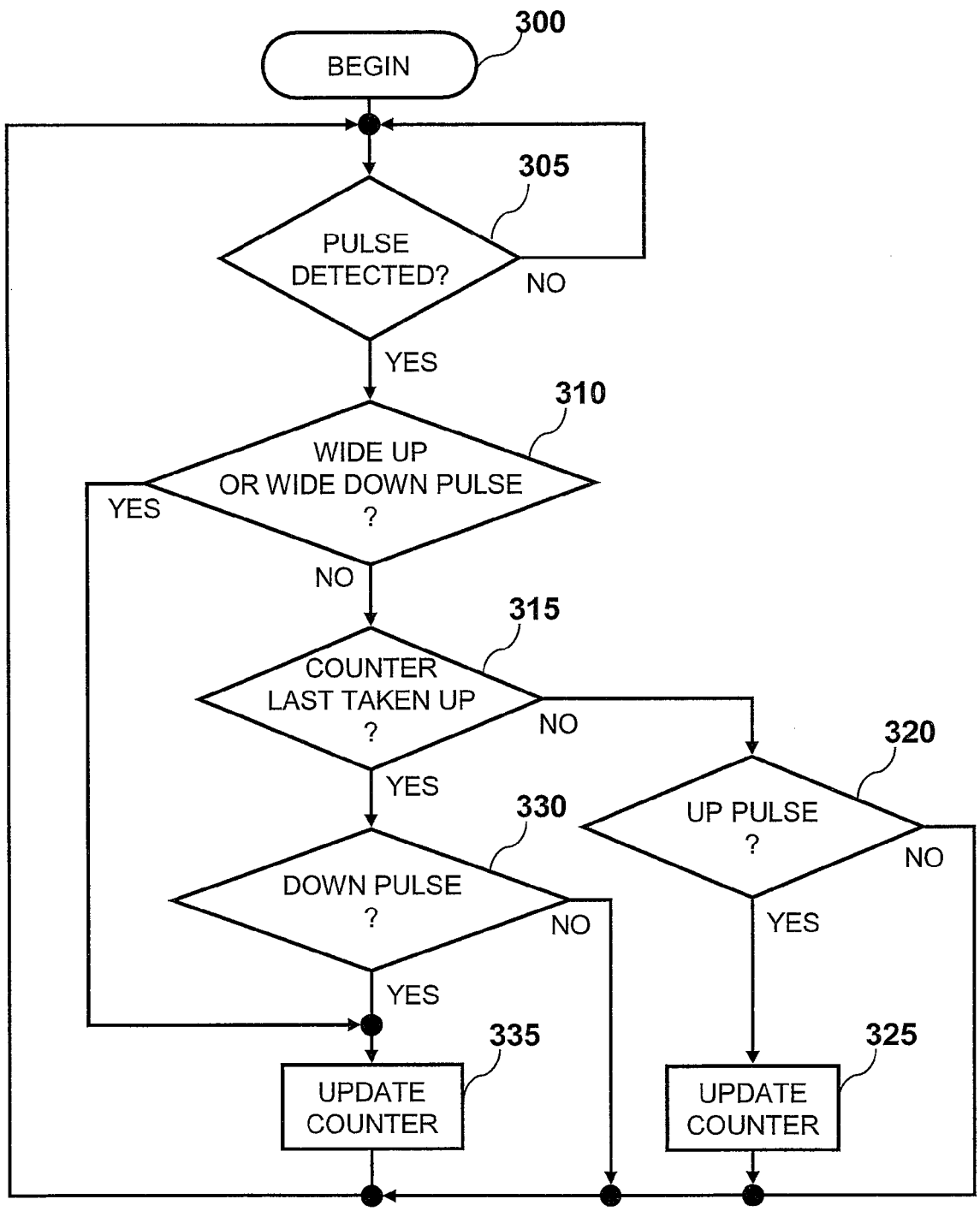
FIG. 3 is a high-level logical flow diagram of a method for maintaining the frequency lock established in the method of FIG. 2, in accordance with a preferred embodiment of the invention.

Referring now to FIG. 3, there is illustrated a high-level logical flow diagram of a method for maintaining the frequency lock established by the method shown in FIG. 2, in accordance with a preferred embodiment of the invention. Starting at block 300, control circuit 120 determines whether or not a phase difference pulse had been detected, as depicted in block 305. If a phase difference pulse had not been detected, the process returns to block 305. Once a phase difference pulse has been detected, control circuit 120 determines whether or not the detected phase difference pulse is a wide up pulse or a wide down pulse, as shown in block 310. A phase detector, such as phase detector 115 from FIG. 2, typically has a "dead zone" in which the phase detector cannot determine the difference between the phases of the input signals. Phase detector 115 generates a phase difference pulse when phase detector 115 detects a phase difference larger than the dead zone. As utilized herein, a wide pulse refers to a pulse that is generated when phase detector 115 detects a phase difference greater than the smallest increment of DCO 125 multiplied by multiplier m.

If the detected phase difference pulse is a wide up pulse or a wide down pulse, control circuit 120 updates counter 121 to show that phase detector 115 last sent an up pulse or a down pulse, as depicted in block 335, and the process returns to block 305. Otherwise, if the detected pulse is neither a wide up pulse nor a wide down pulse, control circuit 120 determines whether or not the counter signal is last taken up, as shown in block 315.

If the counter signal is not last taken up (i.e., the counter signal is last taken down), control circuit 120 determines whether or not the detected phase difference pulse is an up pulse, as depicted in block 320. If the detected phase difference pulse is not an up pulse, the process returns to block 305. If the detected phase difference pulse is an up pulse, control circuit 120 updates counter 121 to show that phase detector 115 last sent an up pulse, as depicted in block 325, and the process returns to block 305.

However, if the counter signal is last taken up, control circuit 120 determines whether or not the detected pulse is a down pulse, as shown in block 330. If the detected pulse is not a down pulse, the process returns to block 305. If the detected pulse is a down pulse, control circuit 120 updates counter 121 to show that phase detector 115 last sent a down pulse, and the process returns to block 305. Control circuit 120 thus utilizes counter 121 to continuously monitor the state of digital frequency multiplier 100 and thereby maintain the frequency lock.

As has been described, the present invention provides an improved digital frequency multiplier circuit. The digital frequency multiplier circuit of the present invention locks an output modulation frequency and monitors the state of the digital frequency multiplier to maintain the lock. Basically, a control circuit within the digital frequency multiplier circuit aligns a feedback signal with an external reference clock signal. If there is a phase difference between the feedback signal and the reference clock signal, the control circuit adjusts a DCO to align the feedback signal with reference clock signal. The control circuit then locks a modulation frequency of the DCO and monitors the state of the digital frequency multiplier circuit to maintain the lock.

While the invention has been particularly shown and described with reference to a preferred embodiment, it will be understood by those skilled in the art that various changes in form and detail may be made therein without departing from the spirit and scope of the invention.

What is claimed is:

1. A digital frequency multiplier circuit comprising:
   a digitally controlled oscillator (DCO) for generating an internal feedback signal;
   a phase detector for detecting a phase difference pulse between said internal feedback signal and an external reference clock signal; and
   a control circuit, coupled between said phase detector and said DCO, for adjusting said DCO to align said internal feedback signal with said external reference clock signal in response to a detection of a phase difference between said internal feedback signal and said external reference clock signal, wherein said control circuit locks a modulation frequency of said DCO and monitors a state of said digital frequency multiplier circuit to maintain said lock, wherein said control circuit includes a counter for tracking state changes, and wherein said control circuit maintains the state of said digital frequency multiplier circuit by:
   determining whether a phase difference pulse representing the phase difference is detected,
   in response to detecting the phase difference pulse, the control circuit determining whether the detected phase difference pulse is a wide pulse including either a wide up pulse or a wide down pulse, wherein the wide pulse is generated when the phase detector detects a phase difference greater than a smallest increment of an output frequency of the DCO multiplied by a multiplier m,
   if the detected phase difference pulse is a wide pulse, updating the counter to indicate that the phase detector had last sent the wide up pulse or the wide down pulse to the counter,
   if the detected phase difference pulse in not a wide pulse, determining whether the phase detector had last sent either a first up pulse or a first down pulse to the counter,
   if the phase detector had last sent the first down pulse to the counter, determining whether the detected phase difference pulse is a second up pulse,
   in response to determining that the detected phase difference pulse is the second up pulse, updating the counter to show that the phase detector had last sent the first up pulse,
   if the phase detector had last sent the first up pulse to the counter, determining whether the detected phase difference pulse is a second down pulse, and
   in response to determining that the detected phase difference pulse is the second down pulse, updating the counter to show that the phase detector had last sent the first down pulse.

2. The digital frequency multiplier circuit of claim 1, wherein said phase detector generates a phase difference signal when a phase difference between said internal feedback signal and said external reference clock signal has been detected.

3. The digital frequency multiplier circuit of claim 1, wherein said control circuit disables said DCO before adjusting said DCO to align said internal feedback signal with said external reference clock signal.

4. The digital frequency multiplier circuit of claim 3, wherein said control circuit re-enables said DCO after adjusting said DCO to align said internal feedback signal with said external reference clock signal.

5. The digital frequency multiplier circuit of claim 1, wherein said counter further includes a shift register.

6. A method for maintaining a locked state of a digital frequency multiplier circuit, said method comprising:

determining whether a phase difference pulse representing a phase difference is detected by a phase detector, wherein the phase difference is between an internal feedback signal generated by a digitally controlled oscillator (DCO) and an external reference clock signal;

in response to detecting the phase difference pulse, determining whether the detected phase difference pulse is a wide pulse including either a wide up pulse or a wide down pulse, wherein the wide pulse is generated when the phase detector detects a phase difference greater than a smallest increment of the DCO multiplied by a multiplier m;

if the detected phase difference pulse is a wide pulse, updating a counter within a control circuit to indicate that the phase detector had last sent the wide up pulse or the wide down pulse to the counter;

if the detected phase difference pulse in not a wide pulse, determining whether the phase detector had last sent either a first up pulse or a first down pulse to the counter, if the phase detector had last sent the first down pulse to the counter, determining whether the detected phase difference pulse is a second up pulse, in response to determining that the detected phase difference pulse is the second up pulse, updating the counter to show that the phase detector had last sent the first up pulse, if the phase detector had last sent the first up pulse to the counter, determining whether the detected phase difference pulse is a second down pulse, and in response to determining that the detected phase difference pulse is the second down pulse, updating the counter to show that the phase detector had last sent the first down pulse.

\* \* \* \* \*